United States Patent [19]
Karplus

[11] Patent Number: 5,157,671
[45] Date of Patent: Oct. 20, 1992

[54] SEMI-SYSTOLIC ARCHITECTURE FOR DECODING ERROR-CORRECTING CODES

[75] Inventor: Kevin Karplus, Santa Cruz, Calif.

[73] Assignee: Space Systems/Loral, Inc., Palo Alto, Calif.

[21] Appl. No.: 529,974

[22] Filed: May 29, 1990

[51] Int. Cl.⁵ .............................................. G06F 11/10
[52] U.S. Cl. ..................................... 371/43; 371/37.1
[58] Field of Search ............... 371/43, 37.1, 49.2, 371/44, 45, 20.5, 67.1, 62

[56] References Cited

U.S. PATENT DOCUMENTS

| | | | |
|---|---|---|---|
| 3,250,900 | 5/1966 | Diamant | 371/49.2 |
| 3,416,132 | 12/1968 | MacSorley | 371/49.2 |
| 4,074,228 | 2/1978 | Jonscher | 340/146.1 AQ |
| 4,295,218 | 10/1981 | Tanner | 371/40 |
| 4,404,674 | 9/1983 | Rhodes | 371/43 |
| 4,654,854 | 3/1987 | Heppe | 371/43 |
| 4,669,084 | 5/1987 | Hartman et al. | 371/43 |
| 4,683,571 | 7/1987 | Yamagishi | 371/37 |
| 4,882,733 | 11/1989 | Tanner | 371/37.1 |
| 4,939,734 | 7/1990 | Heichler | 371/43 |
| 4,958,350 | 9/1990 | Worley, III et al. | 371/37.1 |

Primary Examiner—Robert W. Beausoliel
Assistant Examiner—Phung My Chung
Attorney, Agent, or Firm—Townsend and Townsend

[57] ABSTRACT

Structures for applying a modification of Tanner's Algorithm B to decode convolutional codes and cyclic and quasi-cyclic error-correcting block codes. The structures comprise one or more parity processors and one or more update processors, wherein the parity equations for a block of code are computed by the parity processors and the reliability of each bit of the result is updated in the update processors using only one register for each bit and without storing received data past the first iteration. The modification to Tanner's Algorithm B is such that each iteration in the updating process is a function only of the results of the immediately previous iteration. A decoder structure receives data serially at a rate of one bit plus soft-decision inormation per clock cycle. The invention is applicable to decoding error-correcting codes used in digital communications.

21 Claims, 8 Drawing Sheets

SEMI-SYSTOLIC ARCHITECTURE FOR DECODING ERROR-CORRECTING CODES

BACKGROUND OF THE INVENTION

This invention relates to efficient decoding of error-correcting codes and more particularly to architectures for decoding large block error-correcting codes based on a class of non-optimal but computationally efficient algorithms developed by Professor Michael Tanner of the University of California at Santa Cruz and known as Tanner's Algorithm B (hereafter Algorithm B).

Error-correcting codes are used in digital communications for conveying digitized information through noisy channels. Noise causes errors to occur in the received data. In the past, two approaches to decoding error-correcting codes have become standard. One approach employs convolutional codes of relatively short constraint lengths and the Viterbi optimal decoding algorithm. Although optimal decoding can be done by the Viterbi algorithm, the computational cost is high, and the computational cost grows exponentially with the size of the code. Therefore, the Viterbi algorithm is limited to relatively simple codes that do not have particularly good performance.

The second approach employs BCH codes and the Berlekamp algorithm, as for example described in *Algebraic Coding Theory*. by E. R. Berlekamp, (NY: McGraw-Hill Publishers, 1968). The Berlekamp decoding algorithm is preferred at low error rates where use of a code with a large minimum distance is more important than use of soft-decision information about the value of a received bit. The Viterbi algorithm is preferred at high error rates, as it uses soft-decision information optimally to recover the communicated information, and although these characteristics are described in U.S. Pat. No. 4,295,218, they are repeated here in summary.

Tanner's Algorithm B is a departure from both the Viterbi algorithm and the Berlekamp algorithm. Reference is made to U.S. Pat. No. 4,295,218 for a description thereof. A brief description of Tanner's Algorithm B and of terms used in the description of the invention is included herein. An understanding of the characteristics of Tanner's Algorithm B is important for an understanding of the present invention.

A linear error-correcting code can be represented as set of parity equations. For convolutional codes, the set is infinite, but it has a regular structure that can be compactly described. For block codes, the set is finite and can be usefully represented by a parity check matrix.

A block is a code word if, and only if, it is in the zero-space of the parity check matrix. Error-correcting codes are used by choosing a code word based on the data to be communicated, sending the code word over the noisy channel, identifying the permissible code word most like or closest to the received word, and recovering the data. A decoding processor or its underlying algorithm has the task of finding the nearest code word to a received word.

To understand Tanner's Algorithm B, consider a graph that represents the code. The graph is constructed by viewing the parity matrix as the incidence matrix of a bipartite graph connecting nodes representing data bits to nodes representing parity equations. For convolutional codes, a similar graph (infinite rather than finite) can be constructed.

Algorithm B can be viewed conceptually as the placement of a processor at each node of the bipartite graph with communication links on the edges. The bit nodes have bit processors, and the parity equation nodes have parity processors. Decoding starts by putting the input data into each bit processor and then sending the input data out from each bit processor to the parity processor. Each parity processor computes the exclusive-OR of the input bits connected to it. The corresponding parity equation is satisfied if, and only if, the result of the exclusive-OR is logic zero (FALSE). The results of the parity computations are sent back to the bit processors, which change their bit values if the majority of the parity computations are logical 1's, i.e. the parity equations are not satisfied.

If soft-decision information is available, that is, if the initial input data comes with reliability weights, the same interconnection structure can be used in a more sophisticated way. Each parity processor must compute not only whether a parity equation is satisfied, but it must also tell the bit processors how seriously to take the information. This can be done by having each parity processor compute the minimum of all data bit reliabilities excluding the data bit being modified. The bit processors then add the data bit reliability to the sum of the reliabilities of all the satisfied parity equations, and subtract the reliabilities of the unsatisfied equations. If the resulting reliability is less than zero, the data bit is changed, and the reliability negated.

The process of sending data bits and reliabilities to the parity processors and then updating the data bits based on what the parity processors return can be repeated. For the codes that have been examined, 3 or 4 iterations are usually enough to correct all the errors that can be corrected by this technique.

For convolutional codes, putting a processor at every node of an infinite graph is not practical. However, by limiting the number of iterations of the decoding process, the distance that information is propagated can be limited. A finite structure can be constructed taking advantage of the limitation on propagation, and the structure can be re-used to represent different portions of the infinite graph.

Tanner's Algorithm B is explicitly designed to decode well (though not optimally) using little computation. However, prior implementations of Tanner's Algorithm B required a separate register for each connection between a bit and a parity equation, and it required a register in each bit processor to store the originally-received data through all iterations. Furthermore, all data bits had to be received before any processing could be done, requiring more hardware for serial-to-parallel conversion.

A straightforward implementation of Tanner's Algorithm B with a processor at each node of the bipartite graph would require an unreasonable amount of hardware, particularly for the interconnections. For example, for the cyclic code known as the Perfect Distance Set Code of length 73 (PDSC-73), which has 45 data bits and a minimum distance of 10, the bipartite graph implementation of the decoder would require 73 parity processors, 73 update processors, and 657 parallel connections between the processors. Such a structure is difficult or impossible to construct as a single integrated circuit using current technology, and the structure cannot be subdivided conveniently into multiple chips, rendering it impractical to build except for special applications where cost, power dissipation, and size are irrelevant.

A search of the Public Records of the U.S. Patent and Trademark Office uncovered the following patents. These patents, with the exception of the aforementioned Tanner patent, are primarily background information about generally-related art and are of no direct relevance to the present invention.

U.S. Pat. No. 4,295,218 to Tanner describes Tanner's Algorithm B, as discussed above.

U.S. Pat. No. 4,882,733 to Tanner describes subsequent development related to Tanner's Algorithm B and relates to the use of soft decision information. It does not disclose specific techniques adapted to integrated circuit technology implementation.

U.S. Pat. No. 4,074,228 to Jonscher describes error correcting of digital signals wherein the error probability of individual bytes of received data is determined and then used to carry out error correction.

U.S. Pat. No. 4,404,674 to Rhodes describes weighted forward error correcting codes using soft error detection.

U.S. Pat. No. 4,654,854 to Heppe describes techniques for decoding threshold decodable forward error correcting codes.

U.S. Pat. No. 4,669,084 to Hartman et al. describes a Fano type signal processing scheme for error correction processing which among other elements uses a syndrome generator built of a programmable read only memory.

U.S. Pat. No. 4,683,571 to Yamagishi describes a further digital signal decoding scheme.

Because space communications is a major application of high quality error-correcting codes, power dissipation and size are extremely important design parameters.

What is needed is an apparatus that takes advantage of the inherent benefits of Tanner's Algorithm B but is also relatively inexpensive and easy to build using conventional technology, particularly integrated circuit technology.

SUMMARY OF THE INVENTION

According to the invention, a class of structures is provided for applying a modified version of Tanner's Algorithm B to decode convolutional codes and cyclic and quasi-cyclic error-correcting block codes. The structures comprise one or more parity processors and one or more update processors, wherein the parity equations for a block of code are computed by the parity processors and the reliability of each bit of the result is updated in the update processors using only one register for each bit and without storing received data past the first iteration. Tanner's Algorithm B is modified so that each iteration in the updating process is a function only of the results of the immediately previous iteration. A decoder structure is provided that receives data serially at a rate of one bit plus soft-decision information per clock cycle.

A semi-systolic array in each parity processor or update processor coordinates storage and computation, a semi-systolic array being a systolic array of storage and computation cells connected as a cycle through nearest-neighbor connections, together with a broadcast bus for transmitting data to selected cells of the array. Serial communication is provided between the parity processors and the update processors via the broadcast bus of the update processor.

One embodiment of the structure according to the invention (for PDSC-73, the 73-bit perfect difference set code) uses 73 cells in each parity processor and 73 cells in each update processor. In each such processor, 64 cells are simple shift registers and the remaining 9 cells are used for the necessary computation.

Although a small loss of coding gain is caused in the region of interest (when compared with optimal decoding), the architecture permits ready realization of structures in integrated circuits, either as single integrated circuits or easily-interconnected multiple integrated circuits.

The invention will be better understood by reference to the following detailed description and the accompanying drawings.

BRIEF DESCRIPTION OF THE DRAWINGS

$$\phi(x) = x^{57} + x^{56} + x^{45} + x^{37} + x^{31} + x^{27} + x^{24} + x^{22} + 1.$$

$$\phi(x) + x^{57} + x^{56} + x^{45} + x^{37} + x^{31} + x^{27} + x^{24} + x^{22} + 1.$$

DESCRIPTION OF SPECIFIC EMBODIMENTS

The invention described herein is a novel technique and structure for decoding convolutional codes and block codes that have a simple structure to their parity matrices. Three embodiments will be described: first, a general embodiment for convolutional codes; second, a general embodiment for cyclic and quasi-cyclic codes; and third, a specific embodiment for one particular cyclic code (the Perfect Difference Set Code of Size 73).

EMBODIMENT 1

Decoder for Convolutional Codes

The structure of cyclic, quasi-cyclic, and convolutional codes allows a particularly elegant architecture for implementing a specific form of Tanner's Algorithm B. According to the invention, a decoder comprises a pipeline of registers, or a systolic (pipelined) architecture, in which the data moves through a regular array of cells, advancing one cell each clock cycle. Convolutional codes lead to simple pipelined architectures. The simple pipelined architecture can be modified with little additional hardware to handle quasicyclic block codes based on the source convolutional code.

A convolutional code can be viewed as a stream of data bits v(t) and an infinite set of parity equations, where each parity bit P(t) is computed from previous data bits v(t) as follows:

$$P(t) = v(t-i_1) \text{ XOR } v(t-i_2)z \text{ XOR } \ldots \text{ XOR } v(t-i_m), \quad (1)$$

where m is the number of bits involved in each parity equation. The parity equations are linearly independent, so that, if the full set were used, the code rate would be zero. Instead, only a subset of the equations is used. These equations are chosen in a regular way, for example, every fourth equation. The code is determined by which subset of the equations is used for computation, and by the set of positive values selected for $i_1$ through $i_m$.

Selecting every $n^{th}$ equation is equivalent to having n parallel streams of data and one stream of parity computations. An apparatus can be designed to handle parallel streams of data clocked at 1/n times the raw data rate, but for simplicity of explanation, the decoder herein is described as taking one data bit per clock cycle. Any decoder actually constructed is more likely to use parallel data streams, as the clock rate on processing elements is reduced by n.

In a similar way, instead of selecting every $n^{th}$ equation, the equations can be grouped into groups of n sequential equations, and a fixed pattern of p equations can be selected out of each group. This would give n parallel streams of data and p parallel streams of parity computations.

One iteration of Algorithm B requires two computations: 1) computing the parity values P(t), and then 2) computing a modified data sequence v'(t) from the parity values and the old data sequence.

Figure 1:
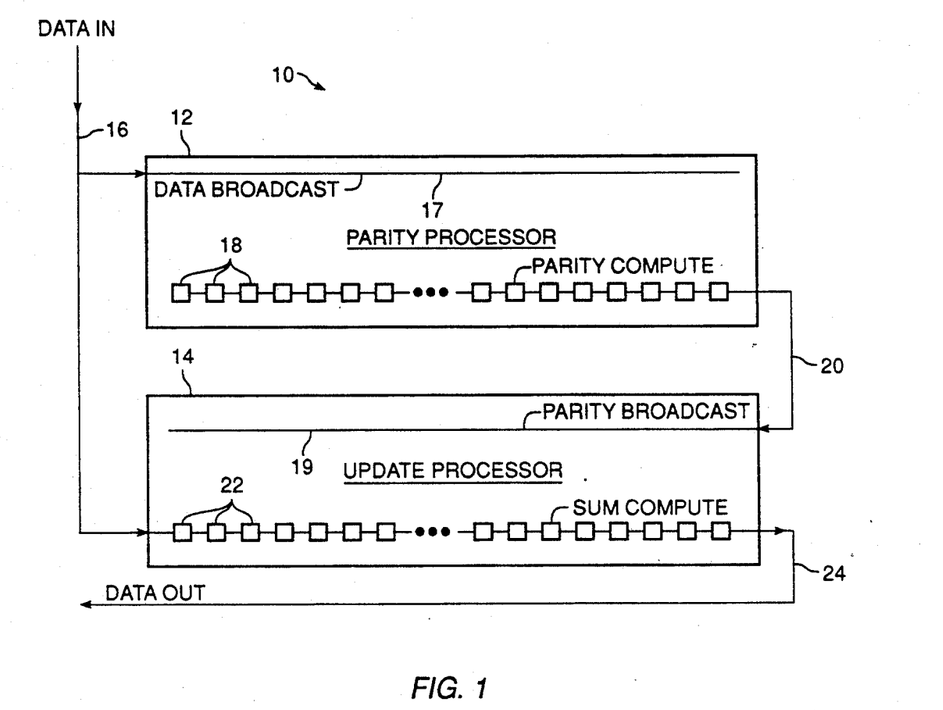
FIG. 1 is a block diagram of a semi-systolic digital data encoder comprising a parity processor and an update processor for one iteration of a decoding algorithm on a convolutional code.

FIG. 1 shows a decoder 10 representing an exemplary embodiment of a structure according to the invention. The decoder 10 comprises a parity processor 12 and an update processor 14 interconnected to compute a single iteration of Tanner's Algorithm B for a convolutional code. In the decoder 10, the first computation is done by the parity processor 12, and the second is done by an update processor 14. The input data is received via an input line or equivalent 16, which is simultaneously broadcast via a bus 17 to all cells 18 of the parity processor 12. The parity processor 12 uses the data on broadcast bus 17 to update the parity values in cells 18, which then transfers the partially-computed parities from one cell 18 to the next.

The parity processor 12 simultaneously broadcasts the completed parity outputs via bus connection 20 on a broadcast bus 19 to all cells 22 of the update processor 14. The update processor 14 then computes the sum, transfers the partial sums from one cell 22 to the next, and then outputs a serial data stream via output line 24.

Because of the fixed pipeline delay in the parity processor 12 and the update processor 14, the output sequence v'(t) is an error-corrected version of $v(t-i_m-1)$.

Figure 2:
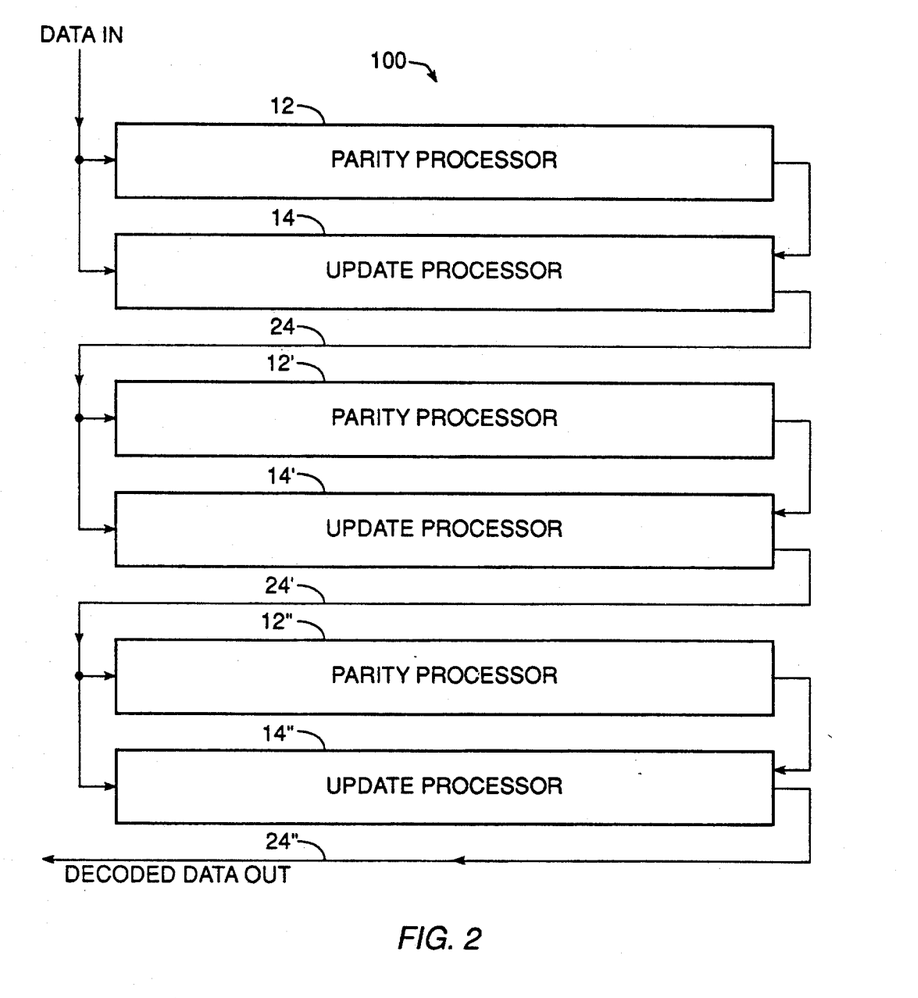
FIG. 2 is a block diagram of a semi-systolic digital data encoder comprising a parity processor and an update processor for three iterations of a decoding algorithm on a convolutional, cyclic or quasi-cyclic code.

The type of architecture shown in FIG. 1 is called semi-systolic because it has both broadcast and systolic (nearest-neighbor pipeline) data movement. The elements of the array come in two types: 1) simple delay elements to keep the data spacing correct, and 2) processing elements to do the computation. A one-iteration decoder, such as decoder 10, works well for hard-decision inputs, but better performance can be achieved with soft-decision data and multiple iterations. A typical decoder using soft-decision information might use three iterations, as decoder 100 shown in FIG. 2. Decoder 100 comprises a first parity processor 12 and a first update processor 14, the output 24 of which is coupled to a second parity processor 12' and a second update processor 14', the output 24' of which is coupled to a third parity processor 12'' and a third update processor 14'', which in turn produces an output on an output line 24''. A three-iteration decoder 110 has a constant pipeline delay of 3 $i_m+3$ cycles.

With hard-decision input data, the parity processor 12 merely computes the parity bits. With soft-decision information, the parity processor 12 also must compute the reliability of each parity bit, which is the minimum of the reliability of the data bits used to compute it. Because the parity bits will be used to modify the data bits, Tanner's Algorithm B requires the minimum one of all data bit reliabilities, excluding the data bit considered for modification.

At first glance, it might appear that m reliability weights are needed for each parity equation. However, it has been determined that only two values are needed:
1) the minimum reliability of all data bits used in the parity computation, and
2) the minimum excluding the least reliable bit.

The parity processor in a soft-decision system must also keep track of the location of the minimum data reliability in each parity computation so that the update processor can decide which of the two parity reliabilities to use for updating a data bit reliability. For example, if r(t) is the reliability of data bit v(t), then the parity processor for a convolutional code computes:

$$P(t) = v(t-i_1) \text{ XOR } v(t-i_2)z \text{ XOR } \ldots \text{ XOR } v(t-i_m) \quad (2)$$

$$M_1(t) = \min(r(t-i_1), r(t-i_2), \ldots, r(t-i_m)) \quad (3)$$

$$l(t) = j, \quad (4)$$

where $$r(t-i_j) = M_1(t) \quad (5)$$

$$M_2(t) = \text{second } \min(r(t-i_1), r(t-i_2), \ldots, r(t-i_m)). \quad (6)$$

A parity processor 12 described hereinabove is for computing all the parity equations, not merely those used in the code. The extra parity computations need to be ignored by the update processor in order to keep the extra parity computations from corrupting the decoding process. Preferably, parallel data streams are used so that only the useful parity equations are computed and no parity processor outputs need be discarded. For example, if only every fourth parity equation were used, P(4t), merely four parallel data streams may be used, namely:

$$v_0(t) = v(4t), \quad (7)$$

$$v_1(t) = v(4t+1), \quad (8)$$

$$v_2(t) = v(4t+2), \text{ and} \quad (9)$$

$$v_3(t) = v(4t+3). \quad (10)$$

Then the computation would be:

$$P_0(t) = P(4t) = v(4t - i_1) \text{ XOR } v(4t - i_2)z \text{ XOR } \ldots \\ \text{XOR } v(4t - i_m) = v_{-i1 \bmod 4}(t - 1/4) \text{ XOR } \ldots \text{ XOR} \\ v_{-im \bmod 4}(t - i_m/4). \quad (11)$$

The update processor 14 for hard-decision data counts the number of violated parity equations that use a given data bit. If more than half of the equations are violated, the data bit is assumed to be in error and is thereupon complemented.

Figure 5:
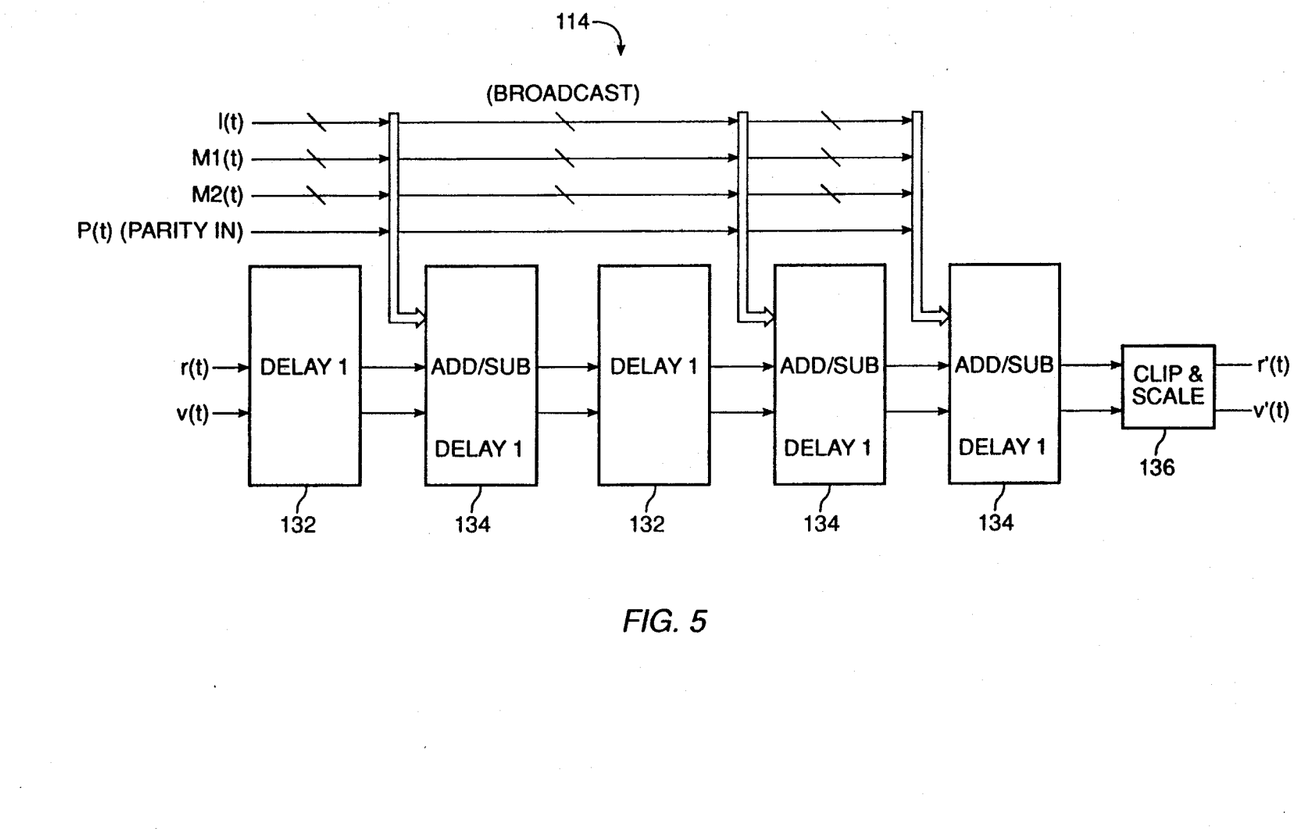
FIG. 5 is a block diagram for an update processor for a convolutional decoder using soft-decision (or hard-decision) input data.

With soft-decision information, an update processor 114 as in FIG. 5 adds the reliability r(t) of the data bit and the reliabilities of the satisfied parity equations and subtracts the reliabilities of the violated parity equations. The result is an updated estimate of the reliability of the data bit r'(t). If the reliability is negative, the bit is inverted, and the reliability is negated. Mathematically, the computation for convolutional codes can be expressed as:

$$s(t + i_m + 1) = r(t) + (1 - 2*P(t + i_1))*M(t + i_1) + \ldots \\ + (1 - 2*P(t + i_m))*M(t + i_m) \quad (12)$$

$$r'(t + i_m + 1) = |s(t + i_m + 1)| \quad (13)$$

$$v'(t + i_m + 1) = v(t) \text{ XOR sign-bit}(s(t + i_{m+1})), \quad (14)$$

where $$M(t + i_j) \text{ is } M_2(t + i_j) \quad (15)$$

if $$j = l(t + i_j) \quad (16)$$

and $$M_1(t + i_j) \quad (17)$$

if $$j \neq l(t + i_j). \quad (18)$$

The discarded parity equations should be ignored in the computation of $s(t + i_m + 1)$.

A decoder may be adjusted by changing the relative weights of r(t) and the parity inputs in computing $s(t + i_m + 1)$ instead of weighting them equally, as shown in the equation for v'(t) above. Soft-decision decoding is usually not completed in a single iteration, as several iterations may be needed to correct data bits. If the weight for r(t) is too low on the first iteration, then noisy channels may cause the algorithm to converge to drastically incorrect code words. Two of the tasks in designing a decoder for a particular code are to choose the number of iterations and to determine what weight to give r(t) on each iteration.

Figure 3:
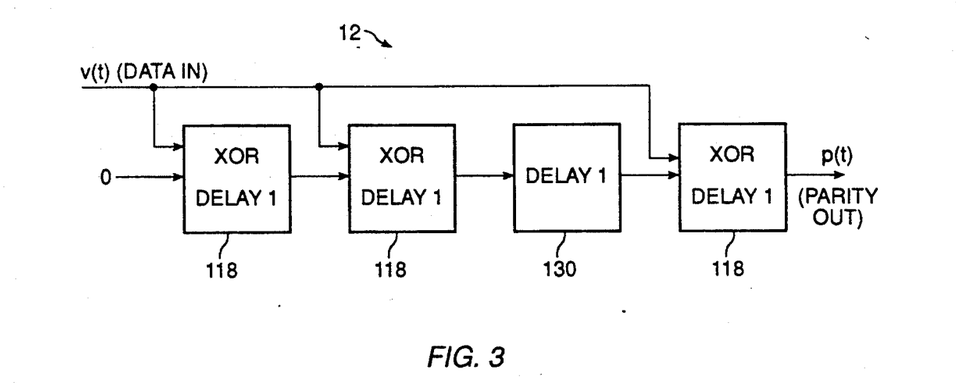
FIG. 3 is a block diagram for a parity processor for a convolutional decoder using hard-decision input data.

FIG. 3 shows a simple hard-decision parity processor 12 in accordance with the invention. The hard-decision parity processor 12 is a simple combination of shift registers and exclusive-OR gates. At each data input point, there is a combination of a shift register and an exclusive-OR gate as a computing storage cell 118. Between cells 118 where there is no data input are simple shift registers 130 for providing single bit delays. Because information propagates through only one level of logic in each clock cycle, high-speed implementation is easy. The code illustrated is for the parity equation:

$$P(t) = v(t - 1) \text{ XOR } v(t - 3) \text{ XOR } v(t - 4). \quad (19)$$

(This code is used for illustration only and is not useful, as it has a rate of zero.)

Figure 4:
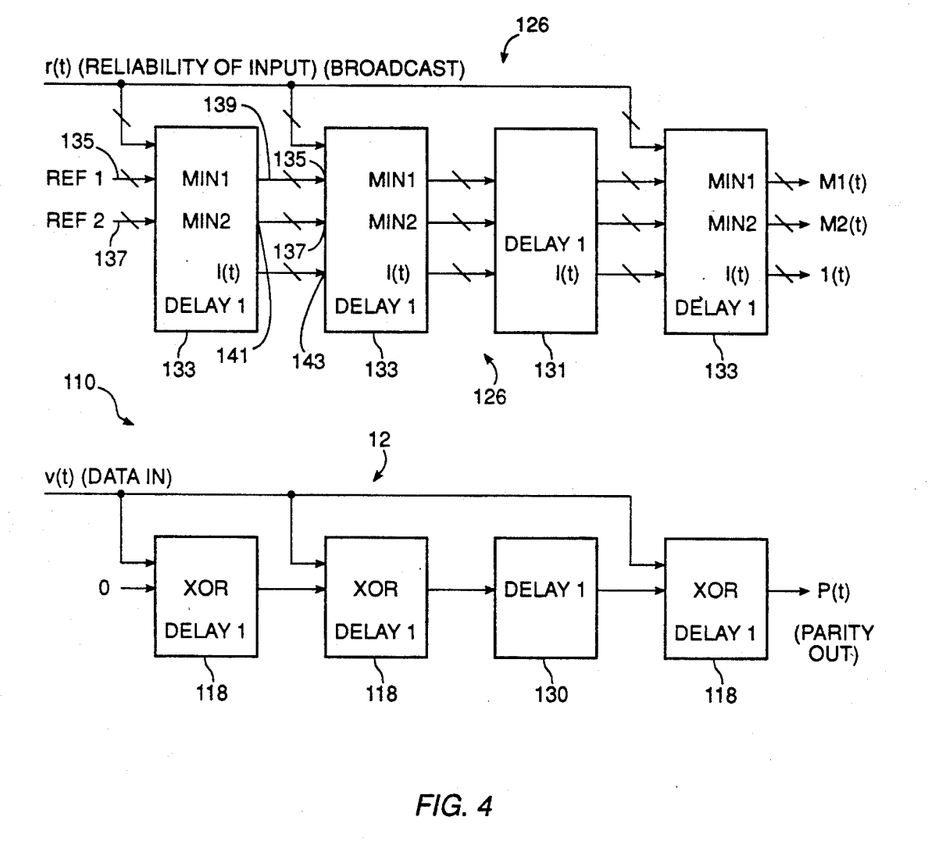
FIG. 4 is a block diagram for a parity processor for a convolutional decoder using soft-decision input data.

FIG. 4 illustrates a simple soft-decision parity processor 110. Processor 110 is typically slower and more complicated than the simple hard-decision parity processor 12. It comprises two subsystems, a reliability processor 126 and a hard-decision parity processor 12, and it is typically employed with an update processor as hereinafter explained. The subsystem based on a hard-decision parity processor 12 is identical in function and purpose to that of FIG. 3. Keeping track of the two lowest data-bit reliabilities, however, requires two comparison operations in each clock cycle. The reliability processor 126 serves this function. The reliability processor 126 comprises two types of elements, a simple delay 131, such as a set of parallel shift registers, and a combination of a two-level digital comparator and a delay, herein a delay comparator 133. A digital comparator herein is merely a device which selects the lowest and next lowest of three digital input values and propagates lowest as min1 and the second lowest as min2.

The delay comparators 133 are disposed in the pipeline at the same positions as the computing storage cells 118 of parity processor 12. The first of the delay comparators 133 receives three inputs: the first bit of the digital value r(t) which is broadcast to all delay comparators 133; and two reference inputs 135, 137. The other delay comparators 133 receive four inputs: other bits of the reliability value r(t); pipeline inputs 135', 137' from min1 139 and min2 outputs 141 (or delayed versions) of previous delay comparator stages 133; and a location value l(t) 143. The first delay comparator 133 identifies the minimum value of the three inputs r(t), first reference input 135 and second reference input 137 as min1 and identifies the second minimum value as min2. The value l(t) is an identifier which identifies which previous delay comparator 133 produces the min1 value Which is propagated. In the case of the first delay comparator 133, the reference values at 135 and 137 are both set to the largest permissible value (11111111), equivalent to infinity for the subject purposes. Thus l(t) identifies first delay comparator 133 as the producer of the current minimum, the minimum value min1 is r(t) and the second minimum value is infinity. The subsequent delay comparators 133 identify the minimum value of the three inputs r(t), min1 and min2. Thus the final minimum values Ml(t) and M2(t) out of the last delay comparator 133 will be the two minimum r(t) values irrespective of time of input, and l(t) will identify time of the lower minimum.

Preliminary studies have indicated that making the reliability weights wider than four bits provides almost no further benefits, and so the comparison operations can be made fairly fast. Should the speed of the comparison operation prove to be a bottleneck, the four-bit comparison can be pipelined one or two bits at a time for greater speed with some penalty in increased complexity.

An update processor is needed to compute a new reliability for each data bit based on the reliability numbers from the parity computations. The update processor 114 for a soft-decision decoder 110 is shown in FIG. 5. (The structure for hard-decision data is not significantly different and is therefore not illustrated.)

The update processor 114 has two types of elements: 1) a dual—input (one for v(t) and one for r(t)) one-clock cycle delay element 132 (shift register cells); and 2) an add/subtract delay element 134 comprising a dual—input adder/subtractor with an add/subtract input for 1(t), plus an associated storage element (not separately shown).

Each add/subtract delay element 134 accumulates and stores a partial sum. It takes the old reliability value and adds if the parity equation is satisfied (=0) or subtracts if the parity equation is not satisfied. Thus the partial sum that will become the new reliability value is increased or decreased by the reliability of the parity computation. The reliability of the parity is Ml(t), except for the unit whose number matches 1(t), which uses M2(t) instead.

Referring to FIG. 5, the critical path for timing analysis in the add/subtract delay elements is the carry propagation, which depends heavily on the width of the words used. The computation of r'(t) involves adding several numbers of roughly the same size (the old value plus the values from the parity processor). If m+1 numbers are added on each iteration, after i iterations $i\log_2(m+1)$ more bits will be needed to represent the result. The number of values to add (m+1) depends on the code being decoded, which might typically be around 10 or 20. Four bits of soft-decision information might be used initially and run for three or four iterations, requiring up to 22 bits on the final iteration. This extra precision makes all the data paths wider but undesirably slows the add/substract delay elements 134.

Two tools can be used to limit the growth of $r^{(i)}(t)$: scaling and clipping. For this purpose, a scale and clip element 136 is provided at the output of the update processor 114. Scaling refers to multiplying the data by a constant before feeding it into the next parity processor in the pipeline. If only powers of two are used as the constants, scaling can be done simply by changing the connections between processors, resulting in a multiplication by bit shifting. Clipping eliminates growth by treating all magnitudes greater than the largest representable value as if they were the largest value.

Simulations are needed to determine the optimum scaling for any particular code. However, shifting two bits (scaling by four) is typical. Although a scaling unit 136 is shown for tutorial purposes, scaling by powers of two requires no explicit extra hardware, since shifting can be accomplished by proper wiring of the pipeline connections. Scaling can be different for the $r^{(i)}(t)$ values passed to the next parity processor and the delayed version passed to the next update processor. The differences in the scaling can be used to change the relative weight of $r^{(i)}(t)$ and parity computations in the next update processor.

Clipping can be implemented in two ways: either 1) in each individual adder, or 2) between the update processor and the next parity processor when scaling has been completed. Clipping between processors requires little hardware, but the adders in the update processor need adequate additional or guard bits to keep them from overflowing before the clipping occurs. Clipping at each addition stage requires sophisticated adders, but one or two guard bits may suffice.

Simulations have disclosed that clipping at each adder and clipping once for each iteration make the algorithm behave differently in detail, but the overall performance of algorithm was not significantly changed.

To make the hardware identical for each iteration, the clipping level should be the same for each iteration. The expected value of the weights grows with each iteration, and so clipping will have more effect in later iterations when violent disagreement about a bit value is less likely. Simulations are useful to determine how much clipping can be done before the performance of the decoder is unacceptably degraded.

Simulation is essential when designing a decoder according to the invention because the design is particularly sensitive to small differences in implementation, including number representation, roundoff, scaling, clipping, number of iterations and relative weight of reliabilities from previous iterations and from parity equations.

Different numbers of bits can be used to represent r(t) in the update processors and in the parity processors. As a consequence, simulation of a detailed design is needed to choose these parameters correctly for any particular code.

EMBODIMENT 2

Decoder for cyclic and quasi-cyclic block codes

The invention can be used with cyclic and quasi-cyclic block codes. The following description of quasi-cyclic codes is based on Michael Tanner's work. It is intended to illustrate the close connection between quasi-cyclic block codes and convolutional codes, but is not part of this invention.

Quasi-cyclic codes are developed from convolutional codes by redefining the meaning of $t-i_j$ in the computation of P(t) in the parity processor for a convolutional code, as under Embodiment 1 above. Because decoding is of a finite length block, the sequence of past bits is not long enough for the first bits of a block. Bits from some other part of the block may be used by the block instead.

The simplest way to change a convolutional code to a block code is to wrap the convolution around a block of length B, forming a cyclic code, for which the parity processor must compute:

$$P(t) = v(kB+t-i_1 \bmod B) \text{ XOR } v(kB+t-i_2 \bmod B) \text{ XOR } \ldots \text{ XOR } v(kB+t-i_1 \bmod B) \quad (20)$$

$$M_1(t) = \min(r(kB+(t-i_1) \bmod B), r(kB+(t-i_2) \bmod B), \ldots, r(kB+(t-i_m) \bmod B)) \quad (21)$$

$$1(t) = j, \text{ where } r(kB+(t-i_j) \bmod B) = M_1(t) \quad (22)$$

$$M_2(t) = \text{second } \min(r(kB+(t-i_1) \bmod B), r(kB+(t-i_2) \bmod B), \ldots, r(kB+(t-i_m) \bmod B)). \quad (23)$$

A different code is defined for each block length and for each pattern of $\{i_1, \ldots, i_m\}$.

If all the parity equations are retained, there remains a cyclic code. If some of the parity equations are discarded in a regular pattern, there remains a quasi-cyclic code. For convolutional codes, the number of parity equations must be reduced to obtain a code rate greater than zero, but there are respectable cyclic block codes that use all B parity equations.

If the block of B parity equations are divided into B/n subblocks, each with n equations, and the same pattern of p<n equations are kept from each subblock, then a quasi-cyclic code has been created having n data rings and p parity rings. The decrease in the number of parity equations yields an increase in the code rate.

By rearranging the data bits into n parallel streams and by rearranging the parity equations into p parallel streams, computation of the unused parity equations can be avoided in the same way as for convolutional codes. The quasi-cyclic codes can also be treated like purely cyclic ones, but with the extra parity computations discarded. For simplicity, only the cyclic decoder structure has been shown herein. The extension to n parallel streams is straightforward. As with convolutional codes, practical implementations will probably choose to use parallel streams for the reduction in clock rate.

Any convolutional code that keeps p out of every n parity equations can be converted to a quasicyclic code with block length $B > i_m$ that is a multiple of n. If the parity and update processors are arranged to have n parallel data paths and p parallel parity paths, the block length can be adjusted easily by changing where the shift registers are tapped to wrap the data and parity information around the block. The same decoder can be used for the convolutional code, and the family of quasi-cyclic block codes can be derived from it.

The quasi-cyclic codes generated from a convolutional code will not all be equally good codes. However, if a family of good codes can be found, they can all be implemented on the same hardware.

Figure 6:
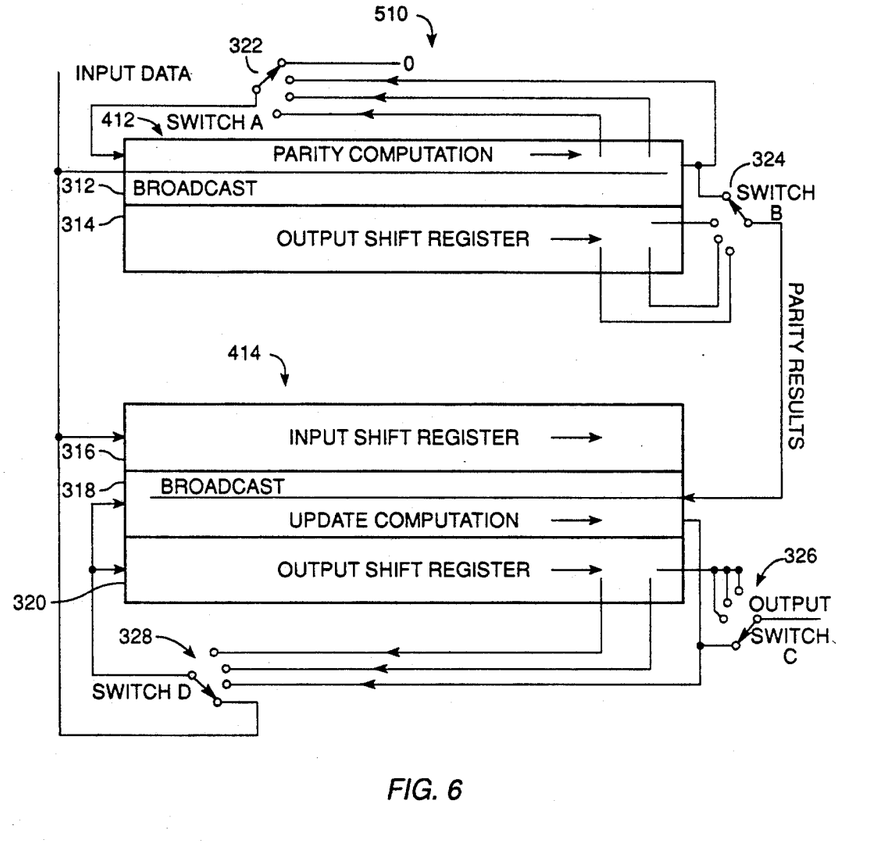
FIG. 6 is a block diagram for a single iteration of a decoder for a family of cyclic or quasicyclic block codes derived from the same convolutional code.

FIG. 6 shows one iteration of a decoder 510 according to the invention for a family of codes for showing the internal structure. It comprises a parity processor 412 coupled to an update processor 414. The parity processor 412 includes a parity computation segment 312 and an output shift register segment 314 which together are shown as a specific example in FIG. 7. The update processor 414 includes an input shift register segment 316, an update computation segment 318 and an output shift register segment 320 which are together shown in a specific example in FIG. 8. Four ganged four-position switches 322, 324, 326 and 328 are switchable to support a family of difference codes, including a "convolutional" mode.

With the switches 322, 324, 326 and 328 set in the "convolutional" setting, the decoder 510 is essentially the same as the decoder 10 shown in FIG. 1, as the extra shift registers are not used. The data is received n units at a time, and the parity equations are computed p units at a time.

With the switches 322, 324, 326 and 328 set for a fixed block length, an entire block of B data bits is received and B*p/n parity equations are computed before any updating is done. The input shift registers 316 of the update processor 414 hold the data bits for the block while the parity computations are done. At the end of each block, the results of the parity computations are transferred in parallel to the output shift registers 314 in the parity processor 412, and the data bits are transferred in parallel from the input shift registers 316 to the update computation units 318, freeing the parity computation elements 312 and the input shift registers 316 for the next block.

The parity results are transferred p units at a time from the output shift register 314 of the parity processor 412 to the update computation element 318 of the update processor 414. After B/n cycles, all the parity values have been transferred, and all the updates stand completed. The results are then transferred in parallel to the output shift registers 320, freeing the update computation units 318 for the next block. The output shift registers 320 of the update processor 414 output n updated data bits (with their new reliability values) on each clock cycle.

More details on how a quasi-cyclic decoder can be implemented are provided hereinbelow. The description relates to a decoder for a specific code which has one parity ring and one data ring (p=n=1).

Although the presentation here has shown cyclic and quasi-cyclic codes derived from convolutional ones, the design of the decoder depends only on the structure of the code, not on how that structure was derived. The decoder design can be used on any cyclic or quasi-cyclic code.

EMBODIMENT 3

Decoder for the 73-bit Perfect Difference Set code

The Perfect Difference Set code was first described by E. J. Weldon, "Difference Set Codes," *Bell Systems Technical Journal*, Vol. 45, 1966, 1045–1055, and was chosen by Michael Tanner for Ford Aerospace Corporation as a consultant to the Western Development Laboratories in Palo Alto, CA, for use in high-speed satellite communications. Tanner's choice of code is based on a different difference set of size 73 than Weldon's, but none of the properties of the code are affected by the choice of difference set. The code is not in itself part of the subject invention. The following description of the code has been provided by Professor Tanner:

"The performance and complexity of a system incorporating an Algorithm B decoder can be illustrated by a system based on a (73,45,10) perfect difference set code. A perfect difference set code of order q for any $q = p^s$ can be constructed from a projective plane of order q and presented as acyclic code using the Singer cycle (see Shu Lin and Daniel J. Costello, Jr., *Error Control Coding: Fundamentals and Applications*. Prentice-Hall, Englewood Cliffs, NJ (1983)). For (73, 45, 10) code, p=2, s=3, and q=8, the code can be defined as a 73×73 circulant parity check matrix H, whose first row contains only 9 ones in positions dictated by a perfect difference set, and each successive row is a cyclic right shift of the previous row. Each row of H corresponds to one of the 73 'lines' in the projective geometry and each column corresponds to one of the 'points'. The H matrix can be interpreted as the incidence matrix of the geometry. Any two lines share exactly one point, and each pair of points is on exactly one line.

"Alternatively, the code can be viewed as a length 73 BCH code with roots 0, 1, 3, 5, 7 whose dual code has a minimum distance 9. A 73-root is found on the field $GF(2^9)$ and so each cyclotomic coset modulo 73 has 9 elements, but roots 5 and 7 are in the same cyclotomic coset, and thus the code has only 28 independent equations. The 73×73 matrix H has rank 28 and 45 linearly dependent equations. Since the first row of H is a perfect difference set, it has the special property that HTH is a matrix whose entries are all one."

In order to realize an apparatus operable in accordance with the invention on the above code, the following factors are relevant:

The code is a block code of length 73,

The code is a linear code, that is, it can be described with 73×73 parity matrix H. A word w is in the code if, and only if, $H_w = 0$.

The code is cyclic, which is equivalent to saying that the parity matrix is circulant, that is, that each row is a cyclic shift of the previous row.

In a block code used according to the invention, each row of the parity matrix of the block code is the cyclic-left-shift of the row above it. Difference-set codes are particularly attractive for Tanner's Algorithm B, since it can be proved that hard-decision decoding up to half the minimum distance can be done in one iteration. Furthermore, three iterations of Tanner's Algorithm B will correct a burst of up to 28 erasures in a block of the PDSC-73 code. Because each block of 73-bits has 45 data bits, it is impossible to correct longer bursts of erasures with any technique, as insufficient information would remain.

The code selected for illustration purposes hereinafter is based on the difference-set polynomial:

$$\phi(x) = x^{57} + x^{56} + x^{45} + x^{37} + x^{31} + x^{27} + x^{24} + x^{22} + 1 \quad (26)$$

This difference-set polynomial defines the first row of the parity matrix used in a decoder according to the invention. The 73 entries of the first row are the coefficients of $x^0$ through $x^{72}$ in the polynomial. Thus the first parity equation is the exclusive-or of bits 0, 22, 24, 27, 31, 37, 45, 56, and 57.

Figure 7:
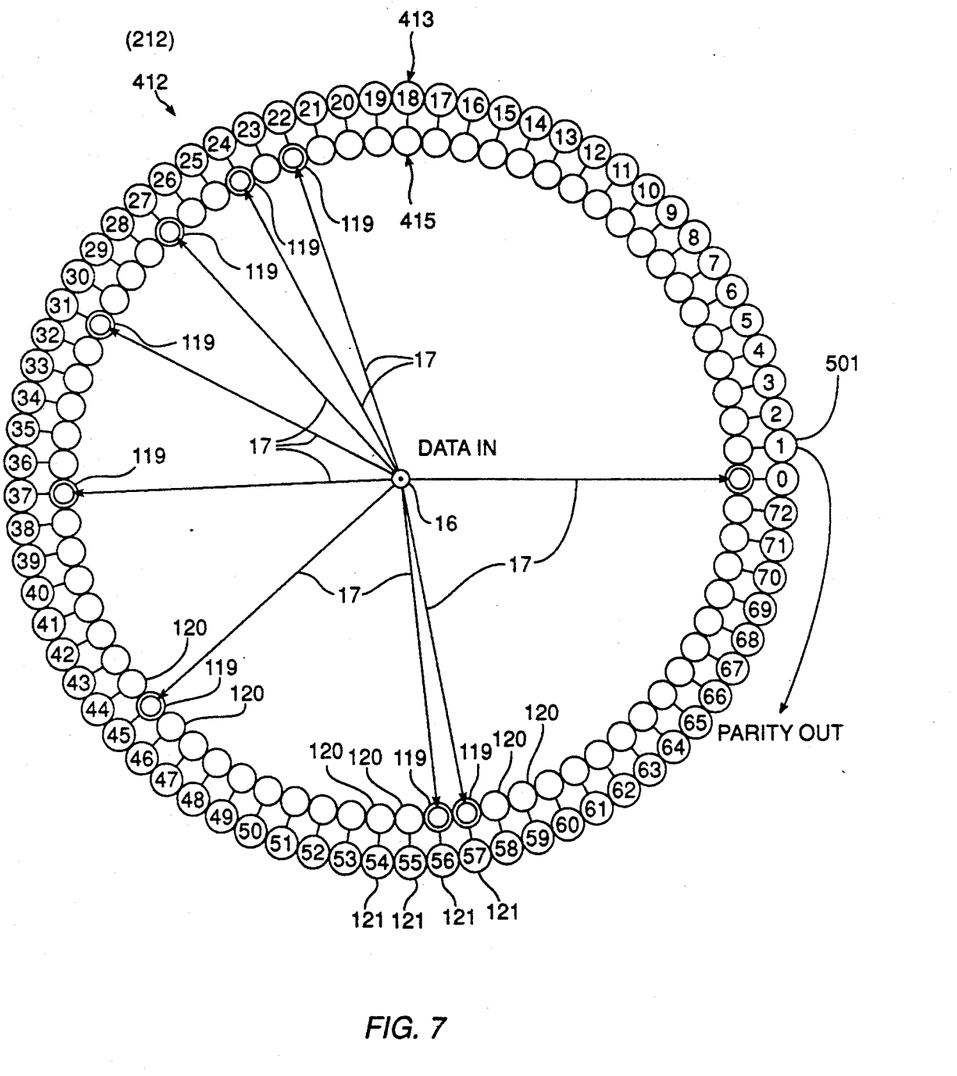
FIG. 7 is a conceptual block diagram for a parity processor for a Perfect Difference Set Code of length 73 based on the polynomial.

FIG. 7 is a conceptual block diagram for a parity processor 412 (corresponding to element 212) for the Perfect Difference Set Code of length 73 based on the polynomial:

$$\phi(x) = x^{57} + x^{56} + x^{45} + x^{37} + x^{31} + x^{27} + x^{24} + x^{22} + 1 \quad (27)$$

The parity processor 412 forms a double concentric ring, an outer ring 413 and an inner ring 415, with fixed spokes 17 from a serial data input port 16. The inner ring 415 is a computation shift register ring having nine elements 119 comprising a combination of an exclusive-OR gate and a minimum of two comparators, as in FIG. 4, elements 118 and 133, interspersed with shift register elements 120, corresponding to elements 130 plus 131 in FIG. 4, totalling 73 elements. Thus the elements 119 and 120 form a 73 unit shift register. It receives its data input through a serial input port 16 and broadcasts the data on a bus 17 (shown as spokes) to the coefficient positions for data defined by the difference-set polynomial through element 119 whereby the data is exclusive-ORed and reliabilities are compared and then stored in the storage units of element 119. The outer ring 413 is formed by storage registers 121.

With each clock cycle, the data is shifted one position in each ring. (The cell number corresponds to the position of the parity values at the beginning of a "new" block.) Data is shifted out at the last position 501 (herein numbered 1) where it is picked up by a subsequent element. At the end of each block and after the data is shifted out of the outer ring 413, the data in the inner ring 415 is parallel shifted into the outer ring 413. The direct correspondence between the architecture of the 73-stage shift register structure and the difference-set polynomial is straightforward and apparent.

UPDATE PROCESSOR

Figure 8:
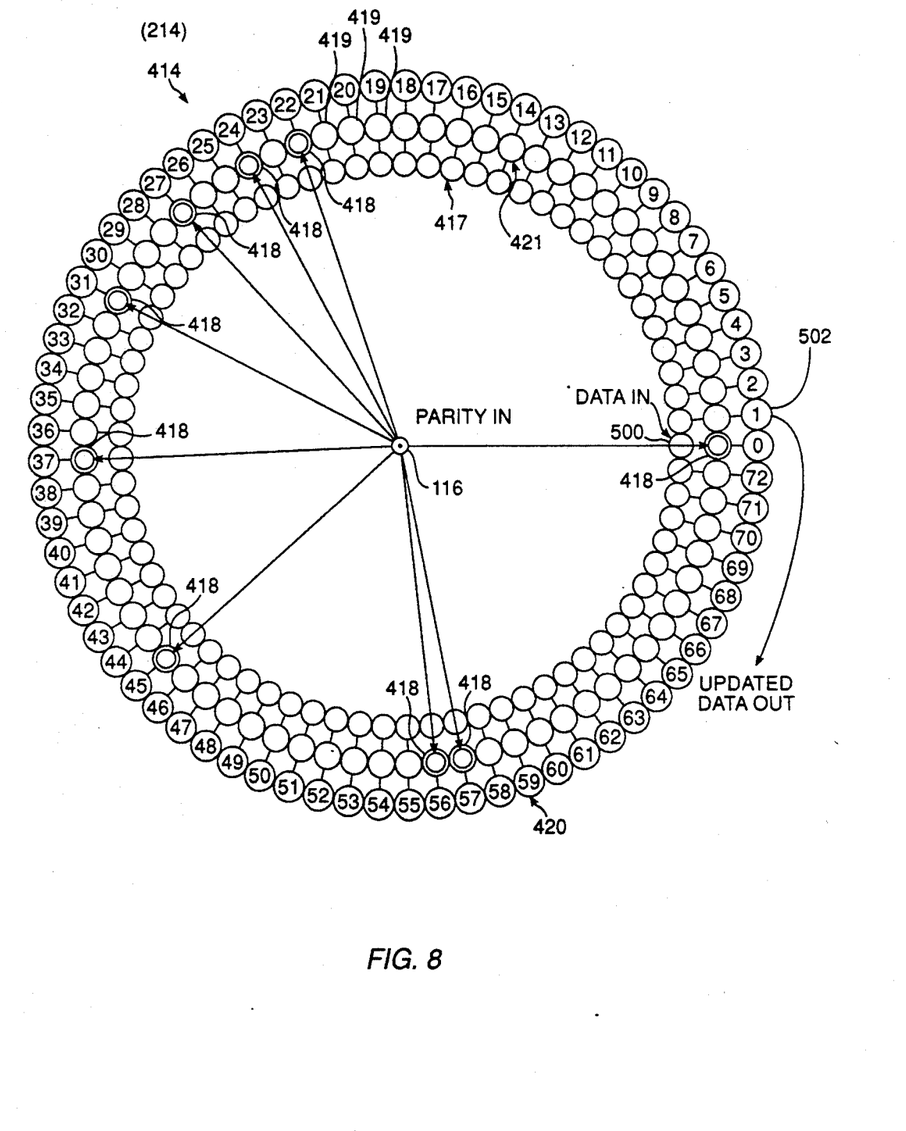
FIG. 8 is a conceptual block diagram for an update processor for a Perfect Difference Set Code of length 73 based on the polynomial.

FIG. 8 is a conceptual block diagram for an update processor 414 (corresponding to element 214) for the Perfect Difference Set Code of length 73.

This architecture of the update processor 414 is realized with an input shift register ring 417, nine adder/-subtractors 418 corresponding to element 134 of FIG. 5, in a ring 421 with storage elements 419, and an output shift register ring 420. Data is received through the zeroeth input 500 of the input shift register ring 417, parity is received through a parity in port 116 which feeds the nine adder/subtractors 418, and updated data is extracted from the output shift register ring at output 502. Its parallel structure with that of the polynomial is also apparent.

FIGS. 7 and 8 clearly illustrate a structure supporting decoding of a cyclic 73-bit block code with minimum distance of 10 and rate 45/73. Because the code is a purely cyclic one, there is no need to discard extra parity computations between the parity and update processors and no need to run multiple parallel streams.

Both the update processor 414 and the parity processor 412 have 73 processing cells, 9 of which do computation, 64 of which are simply shift-register elements to store data. The arrangement of delay cells and active processing cells is determined by the structure of the code.

Other cyclic codes can be realized without departing from the spirit of the invention. For example, if the next larger perfect difference set code (PDSC-273) is chosen, a parity processor could be realized having a minimum distance of 18 with only 17 exclusive-OR gates, 34 minimum-of-two circuits and 17 adders (plus many shift register elements). Such free distances would probably require constraint lengths of 23 or more in convolutional codes, which renders full Viterbi decoders impractical, thus demonstrating the preferability of the present architecture.

Figure 9:
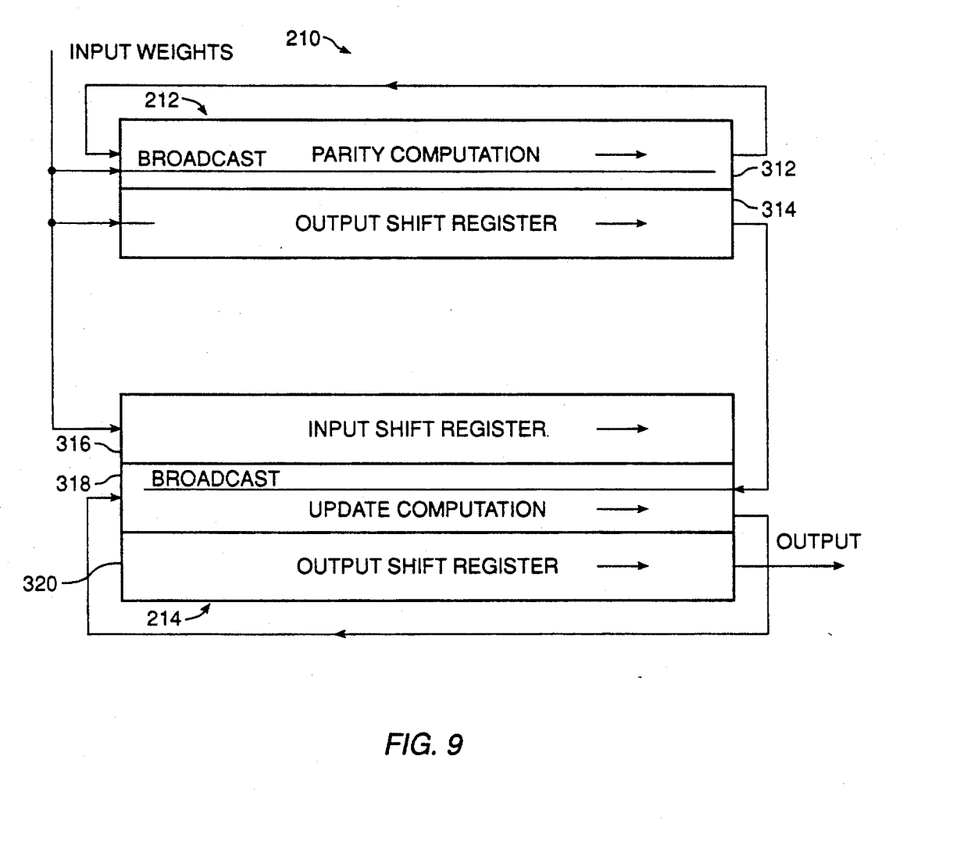
FIG. 9 is a block diagram showing a single iteration of the decoder employing a parity processor of FIG. 7 and an update processor of FIG. 8.

A decoder for the Perfect Difference Set Code described in the quotation of R. Michael Tanner above is shown in FIG. 9 and is based on the design of the structure in FIGS. 7 and 8. FIG. 9 shows one decoder 210 according to the invention for one code. It comprises a parity processor 212 and an update processor 214. The parity processor 212 includes a parity computation segment 312 and an output shift register segment 314 which together are shown in a specific example in FIG. 7. The update processor 214 includes an input shift register segment 316, an update computation segment 318 and an output shift register segment 320 which are together shown in a specific example in FIG. 8.

Parity bits may be computed as the data bits arrive, but the values will not all be correct until the last data bit of a block arrives. At the end of the block, after all the parity bits have been computed, the results are transferred to another set of shift registers. While a new block of data bits comes in, the old parity results are transferred one at a time to the update processor 414.

The specific parity processor 412 shown in FIG. 7 uses two different types of elements: XOR elements for the parity computations, and NOP-P elements to make sure the data arrives at the XOR elements at the right times. The data bit v(t) and its reliability r(t) are broadcast to all the XOR elements. On each clock cycle the NOP-P elements perform the following data movement:

P(R) gets P(L) block of
$M_1(R)$ gets $M_:(L)$
$_2(R)$ gets $M_2(L)$
$1(R)$ gets $1(L)$,
$P_{old}(R)$ gets $P_{old(L)}$
$M_{1,old}(R)$ gets $M_{1,old}(L)$
$M_{2,old}(R)$ gets $M_{2,old}(L)$
$1_{old}(R)$ gets $1_{old}(L)$, and the $i^{th}$ XOR element performs this computation:
P(R) gets P(L) XOR v
$M_1$(R) gets min($M_1$(L),r)
$M_2$(R) gets min($M_2$(L), max($M_1$(L),r))
1(R) gets if (r>$M_2$(L)) then 1(L) else i.
$P_{old}$(R) gets $P_{old}$(L)
$M_{1,old}$(R) gets $M_{1,old}$(L)
$M_{2,old}$(R) gets $M_{2,old}$(L)
$1_{old}$(R) gets $1_{old}$(L).

The NOP-P elements consist of simple shift-register cells. A MOS implementation thereof may be with dynamic registers, because the data is shifted on every clock cycle. The XOR elements need an exclusive-OR circuit for the parity bit, and two digital comparators and some selectors for the $M_1$ and $M_2$ computations. The critical path for timing analysis is the computation of $M_2$, with most of the delay in the comparisons. It has been found through simulation that three bits are enough accuracy for the reliability data. Thus, the comparators can be made fairly fast. The update processor is slightly more complicated than the parity processor, but can still be implemented as a simple semi-systolic array. Because the parity processor gives a full block delay (73 cycles), it is necessary to save an entire block of v(t) and r(t) values before start of the update computation. At the beginning of each block, the saved r(t) and v(t) values are transferred from the input shift registers into the computation shift registers for the update computation. At the end of each block, the results of the update computation are transferred into another set of shift registers for output.

Each update or parity processor adds a delay of 73 cycles, so the delay for one iteration of Tanner Algorithm B is two block times, or 146 cycles. Simulations have shown that three iterations work about as well as more iterations, giving a fixed latency of 438 cycles.

The initial soft-decision data consists of four bits per clock cycle, one bit representing the most likely value for the received channel bit, and three bits indicating the reliability of that value. Three bits of reliability were chosen because simulations showed little additional coding gain with more than three bits, and both chip area and delay increase as the number of bits in the reliability increases.

The growth of the reliability values is controlled by scaling and clipping. In a PDSC-73 code, each data bit is used in 9 parity computations, so that r'(t) is computed by adding 10 numbers of comparable size and may require 4 more bits to represent it than r(t) does. In three iterations, the reliability values can grow by 10 bits, so that if 3 bits of soft-decision information were initially used, 13 bits would needed for the output of the third iteration (14 counting the sign bit), if no scaling or clipping were used.

Simulations for the Perfect Difference Code of length 73 have shown that shifting 2 bits after each iteration (scaling down by a factor of 4) works satisfactorily, limiting the growth to 4 bits in three iterations. With this scaling, the adders in the final iteration's update processor should be eight-bit two's-complement adders.

To further reduce the widths of the data paths and speed up the additions in the update processor, the adders in the update processor may all be 5-bit wide clipping adders. Simulations have shown this arrangement to have negligible degradation of decoding performance when compared to a design with no clipping or scaling, but the circuitry for the design with clipping and scaling is substantially smaller and faster.

NUMBER REPRESENTATION IN THE PDSC-73 DECODER

Several different number representations are possible in the parity processor and the update processor. For the parity processor, reliabilities are always positive numbers, and the data bit used for the exclusive-OR computation is completely separate. For the update processor, it is necessary to represent both positive and negative reliabilities. This can be done with sign-magnitude, one's-complement, or two's-complement representations. The representation in the parity processor is essentially a sign-magnitude representation. Therefore, it is tempting to use sign-magnitude representation in the update processor. One's-complement is easily converted to and from sign-magnitude, but two's-complement adders are easier to build than adders for the other representations.

Two's-complement arithmetic makes for the simplest adders, but has a different range of values for positive and negative numbers, which could cause a bias toward negative values. Because simplicity of hardware is an important feature of a decoder design, two's-complement arithmetic is suggested for design of a PDSC-73 decoder.

The parity processor may use 3-bit reliability weights, with 0 as minimum reliability and 7 as maximum reliability. Having a data bit of 0 with minimum reliability is different from having a data bit of 1 with minimum reliability, which means that the values should not be thought of as 0 to 7, but as having an implicit half-least-significant 1 bit. The resultant reliabilities range from 0.5 to 7.5.

When converted to two's-complement form, the range is $-7.5$ to $+7.5$. All the implicit half-least-significant bits are ones. Thus, they do not need to be represented explicitly. If simply dropped, the input values look like two's-complement numbers in the range $-8$ to 7.

Because 10 numbers are always added for each update in the PDSC-73 update processor, dropping the halves makes the sum consistently 5 units too small (actually 4.5 too small, since it is assumed that the half-least-significant bit is one). By setting five of the carry-in bits in the adders, this bias can be corrected without needing extra circuitry for the half-least-significant bit.

Systolic architectures are particularly attractive for custom and semi-custom integrated circuits, because the regularity of the design and restriction to nearest-neighbor interconnections makes layout easy. This invention therefore represents an advance in mathematically-complex decoders enabling the realization of relatively simple and relatively low-cost structures.

The invention has now been explained with reference to three specific embodiments. Other embodiments will be apparent to those of ordinary skill in the art. It is therefore not intended that the invention be limited except as indicated by the appended claims.

I claim:

1. A decoder for decoding a digital data stream into an updated stream, the digital data stream comprising a plurality of data words in sequence and the digital data stream encoded according to an error-correcting code, the decoder comprising:

at least one parity processing means, said at least one parity processing means coupled to receive as input the digital data stream, for generating a parity data stream, said parity data stream comprising a plurality of computed parities, each computed parity resulting from the operation of a set of parity equations on a selection of data words of the digital data steam, said selection of data words determined by the error-correcting code;

a delay means, coupled to receive as input the digital data stream, for delaying the digital data steam to form a delayed stream; and at least one update processing means, said at least one update processing means coupled to receive as input said parity data stream from said at least one parity processing means and said delayed stream from said at least one parity processing means and said delayed steam from said delay means, for computing a reliability value and a complement reliability value for each data word of the delayed stream and, when said reliability value is greater than said complement reliability value, outputting said data word of said delayed stream as a data word of the updated data stream, otherwise, when said reliability value is less than said complement reliability value, outputting a complement of said data word of said delayed stream as a data word of the updated data stream, said reliability value and said complement reliability equations on a set of computed parities preselected from said parity data stream.

2. The decoder according to claim 1, wherein said at least one parity processing means comprises:

a first data path comprising a first plurality of storage registers in a serial order beginning with a first storage register and ending with a last storage register, whereby a data word is input to said first data path at said first storage register and is passed to successive storage registers in said serial order in response to a clock pulse until said data word reaches said last storage register;

a plurality of exclusive-OR gates, each gate of said plurality of exclusive-OR gates coupled to combine a data word from a selected storage register of said first plurality of storage registers and a data word from said digital data stream into an exclusive-OR sum and provide said exclusive-OR sum to the storage register following said selected storage register in place of said data word passed in response to said clock pulse, each selected storage register selected according to a parity equation of the error-correcting code;

means for distributing a single data word of said digital data stream to said plurality of exclusive-OR gates simultaneously; and means for iteratively outputting a final data word from an output storage register selected from said first plurality of storage registers.

3. The decoder according to claim 1, wherein said at least one update processing means comprises:

a second data path comprising a second plurality of storage registers in a second serial order beginning with a first storage register and ending with a last storage register, whereby a data word is input to said second data path at said first storage register and is passed to successive storage registers in said second serial order in response to a second clock pulse until said data word reaches said last storage register;

a plurality of arithmetic elements, each one of said arithmetic elements coupled to arithmetically combine a data word from a selected storage register of said second plurality of storage registers and a data word from said parity data stream into a resulting data word and provide said resulting data word to the storage register following said selected storage register in place of said data word passed in response to said clock pulse, each selected storage register selected according to a reliability equation of the error-correcting code;

means for distributing a single data word of said parity data stream to said plurality of arithmetic elements simultaneously; and means for iteratively outputting a final data word from an output storage register selected from said second plurality of storage registers.

4. The decoder according to claim 1, wherein the error-correcting code is a cyclic or quasi-cycle code and wherein said at least one parity processing means forms a first recirculating ring and said at least one update processing means forms a second recirculating ring, whereby said recirculating rings are formed by applying an output of said at least one parity processing means to an input of said at least one parity processing means and applying an output of said at least one update processing means to an input of said at least one update processing means.

5. The decoder according to claim 1, wherein the error-correcting code is such that the digital data stream is decodable using a Tanner's Algorithm B modified so that each iteration of operation of said at least one update processing means is a function only of results of the immediately previous iteration, the decoder further comprising computation means incorporated into said at least one update processing means for decoding the digital data stream according to said modified Tanner's Algorithm B.

6. The decoder according to claim 1, wherein only a single parity processing means is employed for computing all parity equations, and wherein said at least one update processing means is constrained to respond to only selected equations of said set of parity equations.

7. The decoder according to claim 1, wherein said at least one parity processing means comprises only a single parity processing means, wherein the digital data stream is provided to said single parity processing means as a plurality of time-parallel data streams, wherein said single parity processing means computes only a set of useful parity equations, set of useful parity equations comprising parity equations whose results are used by said at least one update processing means but not comprising parity equations whose results are not used by said at least one update processing means, and wherein said useful parity equations are used by said at least one update processing means to at least compute an output of said at least one update processing means.

8. The decoder according to claim 1, wherein said delayed stream comprises inspected data words, wherein said set of parity equations comprises a plurality of equation subsets, an equation subset for an inspected data word comprising the parity equations which depend upon said inspected data word, and wherein said at least one update processing means includes decision means for deciding the validity of said inspected data word, said decision means provided with results from said equation subset for said inspected data word, whereby said decision means indicates that said inspected data word is value when the number of said results which indicate incorrect parity is less than a predetermined threshold, otherwise said decision means indicates that said inspected data word is invalid.

9. The decoder according to claim 8 wherein said at least one update processing means further includes complementing means coupled to said decision means for complementing said inspected data word when said decision means indicates that said inspected data word is invalid.

10. The decoder according to claim 1, wherein said at least one parity processing means includes:
reliability determining means for determining reliability of each computed parity of said parity data stream, said reliability being the minima of a time-independent reliability of said digital data stream and a time-dependent index for a lowest of said minima, said reliability for use by said at least one update processing means, and
wherein said at least one update processing means includes:
decision means for deciding the validity of an inspected data word selected from said digital data stream, a result of said decision means having a value chosen from more than two possible values, said result based on said reliability value, said decision means including combination means for bitwise adding said result to said updated data stream and bitwise adding to a reliability value corresponding to said inspected data word if a result of a parity equation indicates that parity is correct, and said combination means for bitwise subtracting said result from said updated data stream and bitwise subtracting to a reliability value corresponding to said inspected data word if said result of said parity equation indicates that parity is not correct.

11. The decoder according to claim 10, wherein said at least one update processing means includes means for selecting a single minimum from time-dependent index for a lowest of said minima.

12. The decoder according to claim 10, wherein only two reliability weight values are employed for decision made by said decision means.

13. The decoder according to claim 10, wherein said reliability determining means comprises a plurality of parallel shift registers coupled in a pipeline; and
a plurality of logic blocks, a logic block interposed after selected shift registers in said plurality of parallel shift registers, said selected shift registers selected according to the error-correcting code, said logic block receiving a first minimum value and a second minimum value form said selected shift register, wherein said logic block comprises a plurality of dual-level comparators and a delay element, said dual-level comparators for selecting a lowest value and next lowest value from a plurality of digital input values, said digital input values comprising said first minimum value and said second minimum value and at least one other digital input value, whereby said lowest value and said next lowest value are input to said delay element, and after a delay, said delay element outputs said lowest value and said next lowest value to the shift register following said selected shift register.

14. The decoder according to claim 13, wherein said reliability determining means further comprises:
scaling and clipping means for limiting resolution and magnitude of said first minimum value and said second minimum value.

15. The decoder according to claim 14, wherein said scaling and clipping means scales by powers of two and uses bit shifting to perform multiplication by said powers of two.

16. The decoder according to claim 1, wherein a data word comprises one bit of data.

17. A decoder for decoding a digital data stream into an updated stream, the digital data stream comprising a plurality of data words in sequency, the digital data stream encoded according to a linear error-correcting code, and the linear error-correcting code having a regular structure which can be specified by coefficients of a polynomial, the decoder comprising:
at least one parity processing means, coupled to receive as input the digital data stream encoded according to the linear error-correcting code, for generating a parity data stream, said at least one parity processing means including a first broadcast input bus and a first shift register means, wherein said first shift register means comprises a ring of serially coupled registers holding data words, and wherein selected registers of said first shift register means include exclusive-OR combining means for combining data from said first broadcast input bus and said data words; and
at least one update processing means, coupled to receive as input data said parity data steam, said at least one update processing means including a second broadcast input bus and a second shift register means, wherein said second broadcast bus is coupled to a serial output of said at least one parity processing means, wherein said second shift register means comprises a ring of serially coupled registers holding data words, and wherein selected registers of said second shift register means include arithmetic element means for combining data from said second broadcast input bus and said data words in said second shift register means.

18. The decoder according to claim 17, wherein said error correcting code is decodable by Tanner's Algorithm B modified so that each iteration in the updating process is a function only of results of an immediately previous iteration.

19. A decoder for decoding a digital data stream encoded according to a quasi-cyclic error-correcting code generated from a convolutional code, said decoder comprising:
at least one parity processing means, said at least one parity processing means coupled to receive as input, in n parallel information paths and p parallel parity paths, said digital data stream containing data encoded according to the quasi-cyclic error-correcting code, for generating a parity data stream, said parity data steam comprising a plurality of computed parities, each computed parity resulting from the operation of a set of parity equations on a selection of data words of the digital data stream, said selection of data words determined by the quasi-cyclic error-correcting code, said at least one parity processing means comprising a first plurality of shift registers coupled in a first serial pipeline with the last shift register in said first serial pipeline coupled back to the first register in said first serial pipeline, thereby forming a first recirculating data loop; and
at least one update processing means, said at least one update processing means coupled to receive, in n parallel information paths and p parallel parity paths, said parity data stream and said digital data stream as time-delayed input data, said at least one update processing means for computing a modified data stream based on data form said parallel information paths, said parallel parity paths, wherein the modification of the data in said modified data stream comprises an updated reliability value and an updated data value of each data word form the digital data stream, said update reliability value and said updated data value computed according to the quasi-cyclic error-correcting code by said at least one update processing means, said at least one update processing means also comprising a second plurality of shift registers coupled in a second serial pipeline with the last shift register in said second serial pipeline coupled back to the first register in said second serial pipeline, thereby forming a second recirculating data loop.

20. The decoder according to claim 19 wherein said at least one parity processing means and said at least one update processing means are configured to decode data from a digital data stream, whereby said data is encoded according to a perfect difference set code.

21. The decoder according to claim 19 wherein said at least one parity processing means and said at least one update processing means are configured to decode data from a digital stream, whereby said data is encoded according to a perfect difference set code having a block length of 73 bits with 45 data bits and a minimum distance of 10.

* * * * *